United States Patent [19]

Imai et al.

[11] Patent Number: 4,611,221
[45] Date of Patent: Sep. 9, 1986

[54] SOLID STATE IMAGE PICK-UP DEVICE

[75] Inventors: Masaharu Imai, Nagano; Ikuo Tohukuji, Okaya; Osamu Onitsuka, Tokyo; Terumasa Morita, Tokyo; Shunpei Tanaka, Tokyo; Hiroshi Matsui, Tokyo, all of Japan

[73] Assignee: Olympus Optical Co., Ltd., Tokyo, Japan

[21] Appl. No.: 500,303

[22] Filed: Jun. 2, 1983

[30] Foreign Application Priority Data

Jun. 17, 1982 [JP] Japan ................................ 57-104319

[51] Int. Cl.⁴ ............................................. H01L 27/14
[52] U.S. Cl. ...................................... 357/30; 357/22; 357/24; 357/41; 365/174
[58] Field of Search .................... 357/22, 30, 30 I, 31, 357/41, 24; 250/338 SE, 370 G, 211 J, 338; 365/174, 185

[56] References Cited

U.S. PATENT DOCUMENTS

| | | | |
|---|---|---|---|
| 3,721,839 | 3/1973 | Shannon | 357/22 |
| 3,886,582 | 5/1975 | Kobayashi et al. | 357/22 |
| 3,964,083 | 6/1976 | Lohstoh | 357/30 |
| 4,427,990 | 1/1984 | Nishizawa | 357/30 |

Primary Examiner—James W. Davie
Assistant Examiner—Georgia Y. Epps
Attorney, Agent, or Firm—Frishauf, Holtz, Goodman & Woodward

[57] ABSTRACT

A solid state image pick-up device comprises a charge storage section for storing the charge corresponding to an image pattern, and a read-out section for reading out the stored charge in this charge storage section. The read-out section is connected to an output of the charge storage section and has a junction type field effect transistor to read out the stored charge as a picture signal.

5 Claims, 4 Drawing Figures

SOLID STATE IMAGE PICK-UP DEVICE

BACKGROUND OF THE INVENTION

This invention relates to a solid state image pick-up device.

In a conventional solid state image pick-up device, the charge storage section comprises a charge transfer device such as a CCD, BBD, or the like, and a read-out section to read out the stored charge from this charge storage section comprises an MOS field effect transistor (MOSFET). The output voltage $V_{out}$ of the output transistor in this read-out section, namely the MOSFET, can be approximately expressed by the following equation when this MOSFET operates in the saturation region. That is, $$V_{out} = R_L \cdot I_d = R_L \cdot \beta\{(V_{OG} - V_{out}) - V_T\}$$

$$= (V_{OG} - V_T) + \frac{1}{2R_L \cdot \beta} -$$

$$\sqrt{\frac{1}{R_L \cdot \beta}(V_{OG} - V_T) + \frac{1}{4R_2{}^L \cdot \beta^2}}$$

wherein, $I_d$: Drain current of the output transistor
$V_{OG}$: Gate voltage of the output transistor
$V_T$: Threshold voltage of the output transistor
$\beta$: Current amplification factor of the output transistor The sensitivity to the signal charge in response to the output voltage can be expressed by the following equation.

$$\frac{dV_{out}}{dQ_S} = \frac{dV_{out}}{dV_{OG}} \cdot \frac{dV_{OG}}{dQ_S} \approx \qquad (1)$$

$$\left(1 - \frac{1}{\sqrt{4R_L \cdot \beta(V_{OG} - V_T) + 1}}\right) \cdot \frac{1}{C_F}$$

wherein, $Q_S$: Signal charge
$C_F$: Capacity of the output gate electrode to the grounded pole $$\Delta V_{OG} = \frac{1}{C_F} \cdot Q_S$$

It will be appreciated from this equation that the capacity of the output gate electronic mostly affects the sensitivity. However, the capacity of the output gate electrode is, in fact, a sum of the capacity of the output diffusion layer and the capacity of the gate electrode of the output transistor. It is the capacity of the gate electrode that affects the sensitivity. Therefore, we have $$C_F = A \cdot C_{OX}$$

wherein, $C_{OX}$: Gate capacity of the output transistor
$A$: Area of the gate electrode It will be understood from equation (1) that it is preferable for $R_L$ and $\beta(V_{OG} - V_T)$ of the output transistor, as other essential factors, to have large values. However, it is impossible to obtain a large value for $R_L$ due to the limitation of the read-out speed, and therefore, the value of $(V_{OG} - V_T)$ cannot be greatly increased. Consequently, it is in fact only a way to increase the value of $\beta$ and to reduce the value of $C_F$. In this case, $\beta$ is expressed by the following equation:

$$\beta = \frac{W}{L} \cdot C_{OX} \cdot \mu$$

wherein,

L: Channel length of the output transistor
W: Channel width of the output transistor
$C_{OX}$: Unit capacity of the gate electrode
$\mu$: Mobility From the above equation, it is most effective to reduce the value of L in order to increase the value of $\beta$. The value of A will also be reduced by doing this, resulting in the reduction of a value of $C_F$. A value of $C_{OX}$ may be reduced to decrease a value of $C_F$. To reduce a value of $C_{OX}$, it may be considered, for example, to increase a thickness of a film oxide. However, an increase in thickness of the film oxide causes a value of $\beta$ to be reduced, so that this method is undesirable. Therefore, the value of L must be decreased. Although the value of L can be presently reduced to 2 to 3 $\mu$m, this only results in an improvement of sensitivity of about 1.5 to 2 times that which is obtained when L is 4 $\mu$m.

On the other hand, a high density solid state image pick-up device has been developed recently in which, as the area of a cell becomes smaller, the output signal charge to be detected also decreases. Therefore, while a read-out circuit section with high sensitivity is desired, for the reasons described above, it is impossible to greatly improve the sensitivity in the read-out circuit section using an MOS type transistor.

SUMMARY OF THE INVENTION

It is therefore an object of this invention to provide a highly sensitive solid state image pick-up device wherein the output transistor comprises a junction type field effect transistor.

According to the present invention, a solid state image pick-up device is provided which comprises a charge storage section for storing the charge corresponding to an image pattern, and a reading section for reading out the stored charge in said charge storage section as a picture signal, said reading section having a junction type field effect transistor to be connected to an output of said charge storage section.

Other objects, features and advantages of the present invention will be apparent from the following description of preferred embodiments, taken in conjunction with the accompanying drawings.

DETAILED DESCRIPTION OF THE PREFERRED EMBODIMENTS

Figure 1:
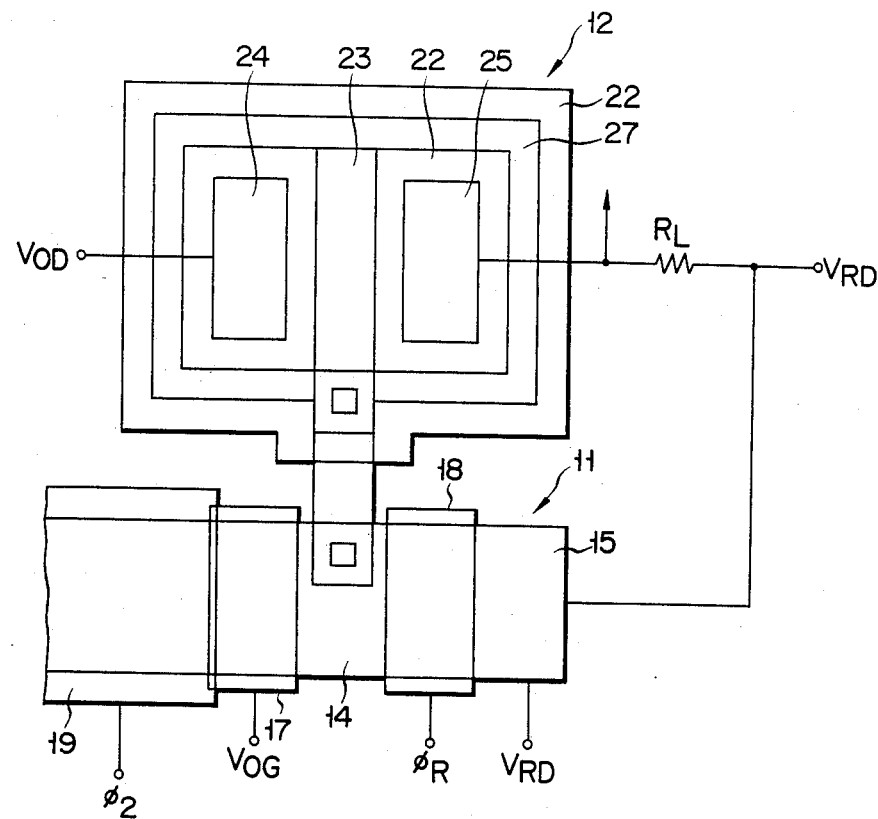
FIG. 1 is a schematic plan view showing a solid state image pick-up device in an embodiment according to the present invention.
Figure 2:
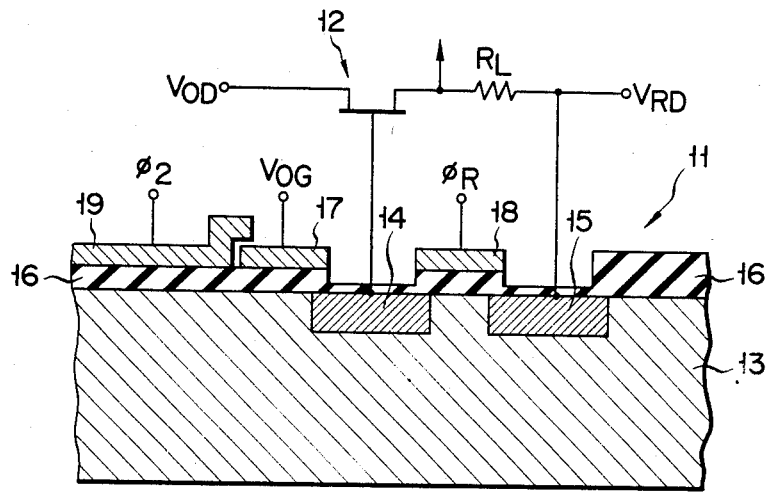
FIG. 2 is a schematic cross-sectional view showing the charge transfer element of the solid state image pick-up device of FIG. 1.
Figure 3:
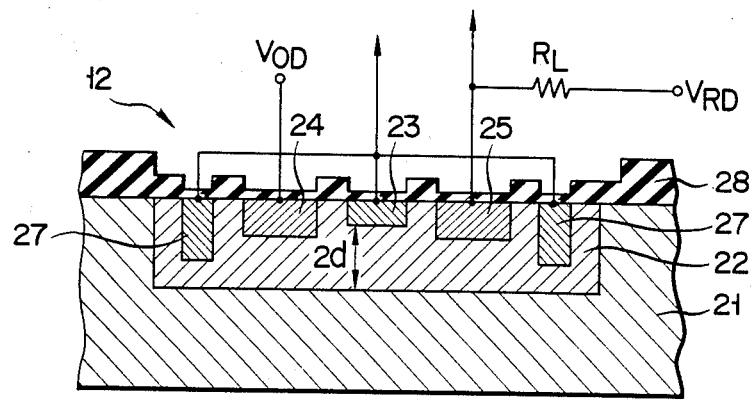
FIG. 3 is a schematic cross-sectional view showing the output transistor of the solid state image pick-up device of FIG. 1.

Referring to a solid state image pick-up device shown in FIG. 1, an output transistor 12 in a read-out circuit is connected to a charge transfer element 11 which constitutes a charge storage section. The charge transfer element 11 is constituted as shown in FIG. 2. That is, N+-type diffusion regions 14 and 15 are formed in a P-type substrate 13. An insulating layer 16 is formed on the substrate 13. An output gate electrode 17 and a reset electrode 18 are formed on this insulating layer 16. The output gate electrode 17 is formed near the output diffusion region 14. The reset electrode 18 is formed between the N+-type output diffusion region 14 and the N+-type reset drain diffusion region 15. The transfer electrode 19 is formed on the insulating layer 16 on the side of the output gate electrode 17. The output diffusion region 14 is connected to a gate region 23 of the output transistor 12 comprising a junction type field effect transistor. As shown in FIG. 3, the output transistor 12 has an N-type diffusion region 22 formed on a P-type substrate 21. The P-type or P+-type gate region 23 is formed in this N-type diffusion region 22. N+-type diffusion regions 24 and 25 are formed on both sides of this gate region 23 in the N-type diffusion region 22. A P+-type diffusion region 27 is formed in the N-type diffusion region 22 so as to surround the regions 23, 24 and 25.

Figure 4:
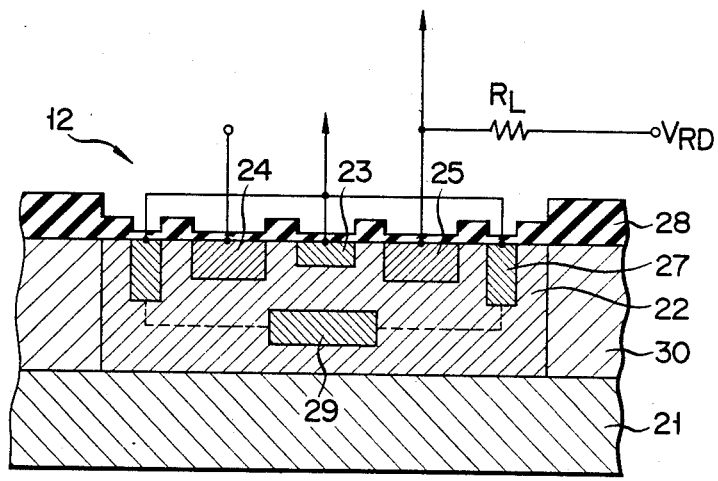
FIG. 4 is a cross-sectional view showing an output transistor of a solid state image pick-up device in another embodiment according to the present invention.

The conductance of an ordinary junction type FET is obtained by the following equation:

$$\frac{dI_d}{dV_g} = g_m = G_0 \left[ \left( \frac{V_d - V_g}{V_p} \right)^{\frac{1}{2}} - \left( \frac{-V_g}{V_p} \right)^{\frac{1}{2}} \right]$$

wherein, $G_0 = \frac{1}{2} \cdot q \cdot \mu \cdot \frac{W}{L} \cdot 2a \cdot N$ $V_d$: Drain voltage
$V_g$: Gate voltage
$V_p$: Pinch-off voltage of the FET
q: Unit charge amount
$\mu$: Mobility in the channel section
2a: Depth of the gate region
W: Diffusion width of the gate region
L: Diffusion length of the gate region
N: Concentration of impurity in the channel However, unlike an ordinary junction type FET, in the junction type FET 12 having a construction as shown in FIG. 3, the gate diffusion layer to control the channel potential is formed only by the diffusion layer 23 and the channel potential is controlled by the potential of the substrate 21. Thus, the conductance of the junction type FET 12 shown in FIG. 3 is reduced to almost half that of an ordinary junction type FET. However, as compared with an MOS type transistor, when the value of W/L is the same, this low conductance of the FET 12 is advantageous under ordinary operational conditions. On the other hand, with respect to the gate capacity, assuming that the thickness $T_{OX}$ of the gate film oxide is, for example, 1,000 Å, the capacity $C_{OX}$ per unit area is approximately $3.54 \times 10^{-8}$ F/cm, while the gate capacity $C_J$ of the junction type FET is obtained by the following:

$$C_J = \sqrt{\frac{\epsilon_{si} \cdot q \cdot N}{2|V_A + V_B|}} - 4.5 \times 10^{-9} \text{ F/cm}$$

wherein, $V_A = 3$ V, $V_B = 0.5$ V, $N = 10^{16}$
$\epsilon_{si}$: Dielectric constant of silicon Thus, the gate capacity $C_J$ is about $\frac{1}{8}$ of the capacity $C_{OX}$ of the MOS type transistor. As shown in FIGS. 1 and 3, since the gate region 23 of the junction type FET 12 is conductive to the channel barrier region 27 for improving the characteristic of the FET 12, the junction capacity in the channel barrier signal 27 is also added to the gate capacity. However, even in this case, the gate capacity is about $\frac{1}{3}$ that of the MOS type transistor. To further reduce this gate capacity ratio, another variation may be possible wherein the channel barrier region 27 in the FET 12 shown in FIG. 3 is not conducted to the gate diffusion region 23 but biased to another potential, for example, $V_{RD}$. As shown in FIG. 4, a further construction is also possible wherein the diffusion region 22 is formed by an epitaxial layer and a floating gate diffusion region 29 is formed therein, and this diffusion region 29 is connected through the channel barrier region 27 to the gate region 23 on the surface. An isolation diffusion region 30, which is the same conductivity type as the substrate 21, is formed for the FET 12 shown in FIG. 4. As a structural adjustment of the charge transfer element 11 and the FET 12, in the case of CCD image pick-up device, the charge transfer element 11 may be a buried channel type CCD register, and its buried diffusion region may be formed by the epitaxial layer 15. For instance, the CCD image pick-up device may be constructed as follows: the depth of the diffusion region of the buried channel CCD is 1 to 1.5 μm, the impurity concentration is about $10^{16}$/cm$^3$, the distance 2a between the gate diffusion regions of the junction type FET is about 0.6 to 1.0 μm, and its impurity concentration is about $10^{16}$/cm$^3$.

As described in the above embodiments, according to the present invention, the output transistor in the signal charge read-out section is constituted by the junction type FET; therefore, the gate input capacity is reduced to about $\frac{1}{3}$ to 1/5 of that which would be obtained in the solid state image pick-up device using a conventional MOS type transistor. With respect to the conductance, it is about $\frac{1}{2}$ or more in the case of the construction shown in FIG. 3, and is substantially equal or better in the case of the construction shown in FIG. 4 as compared with the MOS type transistor. Consequently, even in the junction type FET shown in FIG. 3, the sensitivity will be improved to about 2 to 3 times normal considering the extent of influence of the gate input capacity and conductance on the output voltage. This is highly advantageous for a solid state image pick-up device, since it means that even if the area of the photosensitive cell is reduced by $\frac{1}{2}$ to $\frac{1}{3}$, a signal at an initial level can be obtained. For example, the number of scanning lines in a high quality television is 1,125, which is more than twice the number (525) in the present NTSC system. Therefore, the number of picture elements of the solid state image pick-up device for the high quality television will be more than 1000×1000 (1,100 in the vertical direction × 1,800 in the horizontal direction). In such a large-scale solid state pick-up device, a reduction in the entire area of the charge storage section by $\frac{2}{3}$ or more will advantageously contribute to a reduction of the yield rate for the solid state image pick-up device. In addition, as a solid state image pick-up device for an electronic still camera having a similar picture quality, a reduction in the area of the charge storage section and a high read-out speed will also be highly advantageous. Furthermore, there is an additional effect in that the junction type FET is suitable for a high speed read-out since it is a type of majority carrier semiconductor device.

Although an ordinary junction type FET is used as an output transistor in the above embodiment, an electrostatic induction transistor (SIT), which is a kind of a junction type transistor, may be used as an output transistor. With such a SIT, the dynamic range of the output voltage increases due to the unsaturated property of the SIT, so that an even larger effect can be obtained. However, in this SIT, the impurity concentration in the diffusion region 22 must be reduced by about two figures, for example, to $10^{14}/cm^3$ as compared with an ordinary junction type FET. Hence, it is impossible to form a SIT in the same process as the burying diffusion process of the buried type charge transfer element. Although a charge transfer type solid state image pick-up device is shown in the embodiments, this invention may be applied to other types of solid state image pick-up devices such as X-Y address type devices. Furthermore, the present invention is not limited to an image pick-up device, but for example, in the case where a CCD is used as a temporary memory device, it is also possible to consistently read out a weak signal of the CCD since the read-out circuit has a high sensitivity.

What we claim is:

1. A solid state image pick-up device comprising:
    a charge storage and transfer means for storing a signal charge corresponding to an image pattern, and for transferring said stored signal charge so as to issue an output corresponding to said stored signal charge; and
    reading out means for reading out the stored signal charge in said charge storage means as a picture signal, said reading out means including an output transistor comprising a junction type field effect transistor (J-FET) having a gate region connected to an output of said charge storage and transfer section.

2. The solid state image pick-up device as claimed in claim 1, wherein said junction type field effect transistor comprises:
    a substrate of a first conductivity type;
    a first region of a second conductivity type formed in said first conductivity type substrate;
    a gate region of said first conductivity type formed in said second conductivity type first region;
    second regions of said second conductivity type formed in said second conductivity type region, said second conductivity type second regions being apart from both sides of said first conductivity type gate region;
    a third region of said second conductivity type formed in said first region so as to surround said first conductivity type gate region and said second regions; and
    electrodes coupled at least to said gate region of said junction type field effect transistor.

3. The solid state image pick-up device as claimed in claim 2, wherein said second conductivity type first region is an epitaxial layer.

4. The solid state image pick-up device as claimed in claim 2, wherein said junction type field effect transistor includes a floating gate region in said second conductivity type first region and facing said first conductivity type gate region.

5. The solid state image pick-up device as claimed in claim 2, wherein said junction type field effect transistor includes a first conductivity type isolation region around said second conductivity type first region.

* * * * *